(12) United States Patent
Veal

(10) Patent No.: US 6,985,037 B2
(45) Date of Patent: Jan. 10, 2006

(54) AMPLIFIER ARRANGEMENT, CIRCUIT AND METHOD WITH IMPROVED COMMON MODE REJECTION RATIO

(75) Inventor: Michael Alan Veal, Southampton (GB)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 10/725,867

(22) Filed: Dec. 2, 2003

(65) Prior Publication Data

US 2004/0140854 A1    Jul. 22, 2004

(30) Foreign Application Priority Data

Dec. 4, 2002   (GB)   .................................... 0228278

(51) Int. Cl.
    *H03F 3/45*   (2006.01)
(52) U.S. Cl. ......................................... 330/258; 330/69
(58) Field of Classification Search .................... None
    See application file for complete search history.

(56) References Cited

U.S. PATENT DOCUMENTS 4,551,687 A * 11/1985 Lukens ........................ 330/258
5,043,675 A * 8/1991 Gilbert ........................ 330/258
5,861,775 A * 1/1999 Chen et al. ................... 330/69
6,218,901 B1 4/2001 Lukes et al. ................ 330/258
6,429,700 B1 8/2002 Yang .......................... 327/108

FOREIGN PATENT DOCUMENTS

EP          1176711 A2    7/2001

\* cited by examiner

*Primary Examiner*—Khanh V. Nguyen
(74) *Attorney, Agent, or Firm*—William D. Gill

(57) ABSTRACT

A load driver circuit is provided with an improved common mode rejection ratio. A voltage regulator (150) regulates a ground voltage (120) in response to variations in input voltage (110) and provides a regulated ground voltage. An amplifier stage has a first amplifier (140) with sense inputs coupled to receive voltage signals from a sense resistor (130) of the load driver circuit. The first amplifier (140) is powered by the input voltage (110) and the regulated ground voltage respectively, such that the common mode rejection ratio of the load driver circuit is reduced. In this way an arrangement, circuit and method is provided in which CMRR is drastically improved, rendering a single (or first) stage of a current sensing load driver circuit substantially immune to common mode noise.

16 Claims, 2 Drawing Sheets

US 6,985,037 B2

AMPLIFIER ARRANGEMENT, CIRCUIT AND METHOD WITH IMPROVED COMMON MODE REJECTION RATIO

FIELD OF THE INVENTION

This invention relates to current sensing and particularly but not exclusively to load current sensing in load driver circuits.

BACKGROUND OF THE INVENTION

In the field of this invention it is known that in a simple load driver circuit a differential amplifier is used to amplify a voltage across a current sense resistor carrying a load current.

Referring to FIG. 1, such a circuit is shown having an input node 10 and a ground node 20, between which there is an input voltage $V_{IN}$.

A high side current sense resistor 30 has a first terminal coupled to the input node 10, and a second terminal to be further described below.

An amplifier 40, which is a typical differential amplifier, has an inverting input coupled to the input node 10, a non-inverting input coupled to the second terminal of the resistor 30 and an output coupled to an output node 50.

In operation, a voltage $V_1$ is developed across the resistor 30. The voltage developed is proportional to the current $I_{LOAD}$ flowing in the resistor 30. Ideally, the voltage $V_1$ should be insignificant compared to the input voltage $V_{IN}$. A voltage $V_2$ between the output node 50 and the ground node 20 is defined by:

$$V_2 = A(V^+ - V^-) \qquad \text{Equation 1}$$

Where A is the gain of the amplifier 40, $V^+$ is the voltage at the non-inverting input of the amplifier 40 and $V^-$ is the voltage at the inverting input of the amplifier 40.

In the circuit shown, this may be written as:

$$V_2 = A * V_1 \qquad \text{Equation 2}$$

This circuit works well in theory, and in practice at low frequencies. However, at high frequencies, the amplifier 40 will typically have a low Common Mode Rejection Ratio (CMRR), and the output equation must be re-written to take this into account:

$$V_2 = A(V_1 + V_{CM}/CMRR) \qquad \text{Equation 3}$$

where $V_{CM}$ is any high frequency variation in the input voltage $V_{IN}$. If the CMRR is low, and the common mode voltage $V_{CM}$ is large with respect to $V_1$, then any variation in $V_{IN}$ will cause a large variation at $V_2$.

This is undesirable since the circuit is typically required to have an output equivalent to equation 1 above (namely an output which is linearly proportional to the circuit input voltage) over a large frequency range.

The problem has been addressed in a variety of ways. A standard "instrumentation amplifier" configuration uses three differential amplifiers and does not require precision components. However, an "instrumentation amplifier" arrangement requires higher precision components than are used in this invention. Furthermore, this invention may provide a better CMRR figure than an instrumentation amplifier when a high frequency common mode signal is applied.

EP1176711 A2 discloses a scheme for improving harmonic distortion within a differential amplifier.

U.S. Pat. No. 6,218,901 B1 and U.S. Pat. No. 6,429,700 B1 disclose methods of setting an output common mode voltage of an amplifier with a differential output.

A need therefore exists for an amplifier arrangement, circuit and method with improved CMRR wherein the abovementioned disadvantages may be alleviated.

STATEMENT OF INVENTION

In accordance with a first aspect of the present invention there is provided an arrangement with improved common mode rejection ratio in a load driver circuit having an input voltage and a ground voltage, the arrangement comprising: a voltage regulator adapted to regulate the ground voltage in response to variations in the input voltage and coupled to provide a regulated ground voltage; amplifier means including sense inputs coupled to receive voltage signals from a sense resistor of the load driver circuit, for providing an amplified output voltage; wherein the amplifier means is adapted to be powered by power terminals coupled to the input voltage and the regulated ground voltage respectively, such that the common mode rejection ratio of the load driver circuit is reduced.

In accordance with a second aspect of the present invention there is provided a load driver circuit comprising an arrangement for providing an improved common mode rejection ratio in a load driver circuit having an input voltage and a ground voltage, the arrangement comprising: a voltage regulator adapted to regulate the ground voltage in response to variations in the input voltage and coupled to provide a regulated ground voltage; amplifier means including sense inputs coupled to receive voltage signals from a sense resistor of the load driver circuit, for providing an amplified output voltage; wherein the amplifier means is adapted to be powered by power terminals coupled to the input voltage and the regulated ground voltage respectively, such that the common mode rejection ratio of the load driver circuit is reduced.

In accordance with a third aspect of the present invention there is provided a method for providing an improved common mode rejection ratio in a load driver circuit having an input voltage and a ground voltage, the method comprising the steps of: regulating the ground voltage in response to variations in the input voltage in order to provide a regulated ground voltage; amplifying voltage signals received from a sense resistor of the load driver circuit using amplifier means, for providing an amplified output voltage; wherein the amplifier means is adapted to be powered by power terminals coupled to the input voltage and the regulated ground voltage respectively, such that the common mode rejection ratio of the load driver circuit is reduced.

Preferably the circuit is a high side driver circuit. The amplifier means preferably includes first and second differential amplifiers.

The first differential amplifier preferably has power terminals coupled to the input voltage and the regulated ground voltage respectively and the second differential amplifier preferably has power terminals coupled to the input voltage and the ground voltage respectively.

Preferably the first and second differential amplifiers each have gain values adapted to produce a circuit gain value of substantially unity. The second differential amplifier preferably has a non-inverting input coupled to an output of the first differential amplifier and an inverting input coupled to the regulated ground voltage.

In this way an arrangement, circuit and method is provided in which CMRR is drastically improved, rendering a single (or first) stage of a current sensing load driver circuit substantially immune to common mode noise.

BRIEF DESCRIPTION OF THE DRAWINGS

One amplifier arrangement, circuit and method with improved CMRR incorporating the present invention will now be described, by way of example only, with reference to the accompanying drawings, in which.

DESCRIPTION OF PREFERRED EMBODIMENT(S)

Figure 2:
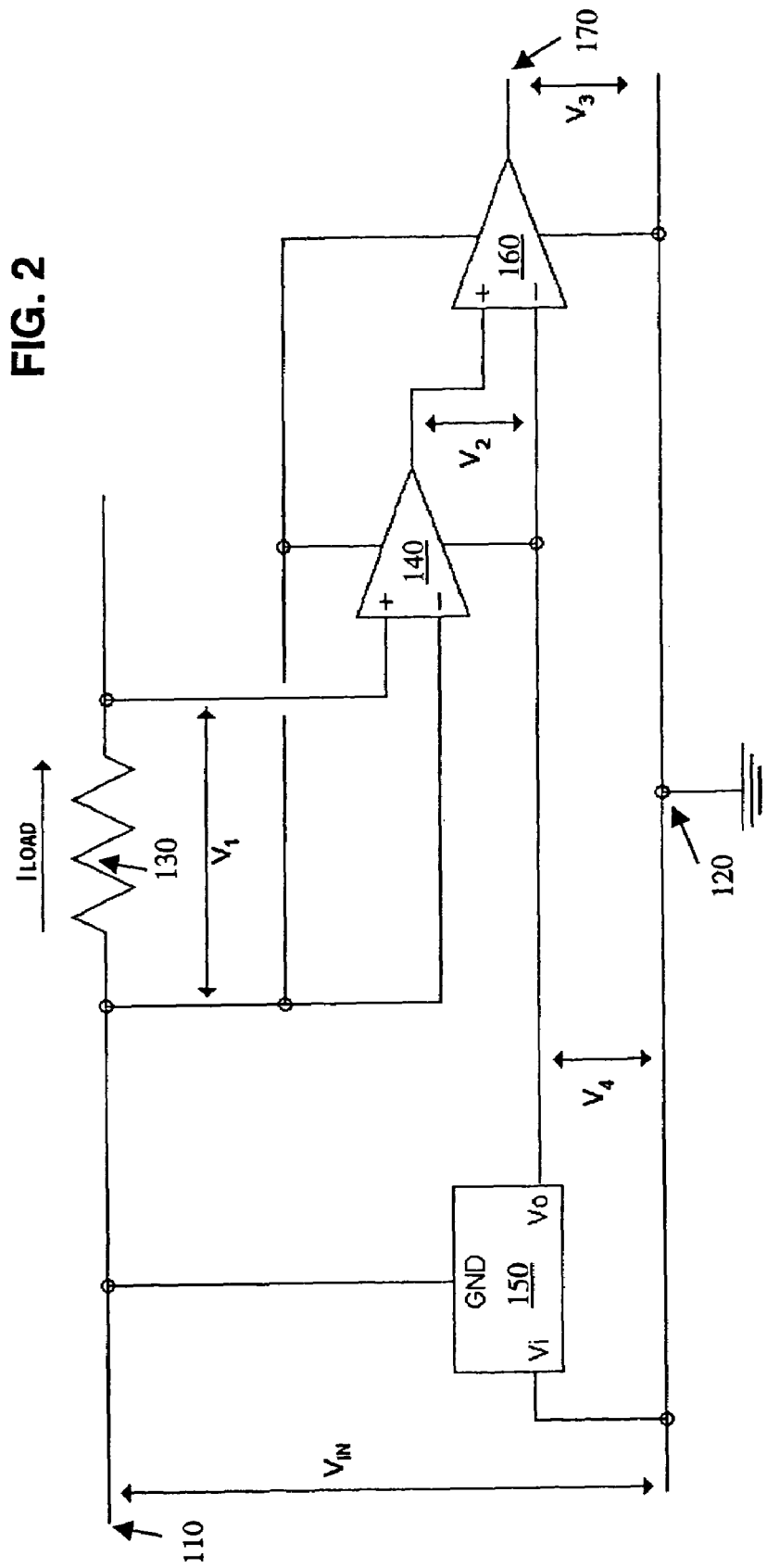
FIG. 2 shows a block schematic drawing illustrating a current sensing high side load driver circuit with improved CMRR incorporating the present invention.

Referring to FIG. 2, there is shown a block schematic drawing of a current sensing high side load driver circuit according to the present invention.

The circuit has an input node 110 and a ground node 120, between which there is an input voltage $V_{IN}$.

A high side current sense resistor 130 has a first terminal coupled to the input node 110, and a second terminal to be further described below.

A first amplifier 140, which is a typical differential amplifier, has an inverting input coupled to the input node 110, a non-inverting input coupled to the second terminal of the resistor 130 and an output to be further described below.

A negative voltage three terminal linear regulator 150 has an input terminal coupled to the ground node 120, a ground terminal coupled to the input node 110 and an output terminal to be further described below.

The first amplifier 140 has a first power terminal coupled to the input node 110 and a second power terminal coupled to the output terminal of the regulator 150.

A second amplifier 160, which is a typical differential amplifier, has an inverting input coupled to the output terminal of the regulator 150, a non-inverting input coupled to output of the first amplifier 140 and an output coupled to an output node 170. The second amplifier 160 has a first power terminal coupled to the input node 110 and a second power terminal coupled to the ground node 120.

In this way an arrangement using two differential amplifiers is used. The first amplifier 140 is powered via the input node 110 and a regulated ground voltage (by virtue of the regulator 150). The second amplifier is powered normally (that is, via the input node 110 and ground node 120).

In operation, the regulator 150 is used to maintain a voltage $V_4$ given by:

$$V_4 = V_{IN} - V_0 \qquad \text{Equation 4}$$

where $V_0$ is the output terminal voltage of the regulator 150.

For this circuit to operate correctly, the input $V_{IN}$ may not swing lower than a value equal to $V_0$ Volts plus the drop out voltage of the regulator 150.

This arrangement of power applied to the first amplifier 140 means that as the input voltage $V_{IN}$ varies, then the first and second power supply terminals and the inverting and non-inverting inputs of the first amplifier 140 track $V_{IN}$.

The first amplifier 140 is therefore immune to variations in $V_{IN}$, and has no common mode input signal. The output equation for this stage may be written as:

$$V_2 = A_1 * V_1 \qquad \text{Equation 5}$$

Where $A_1$ is the gain of the first amplifier 140.

Figure 1:
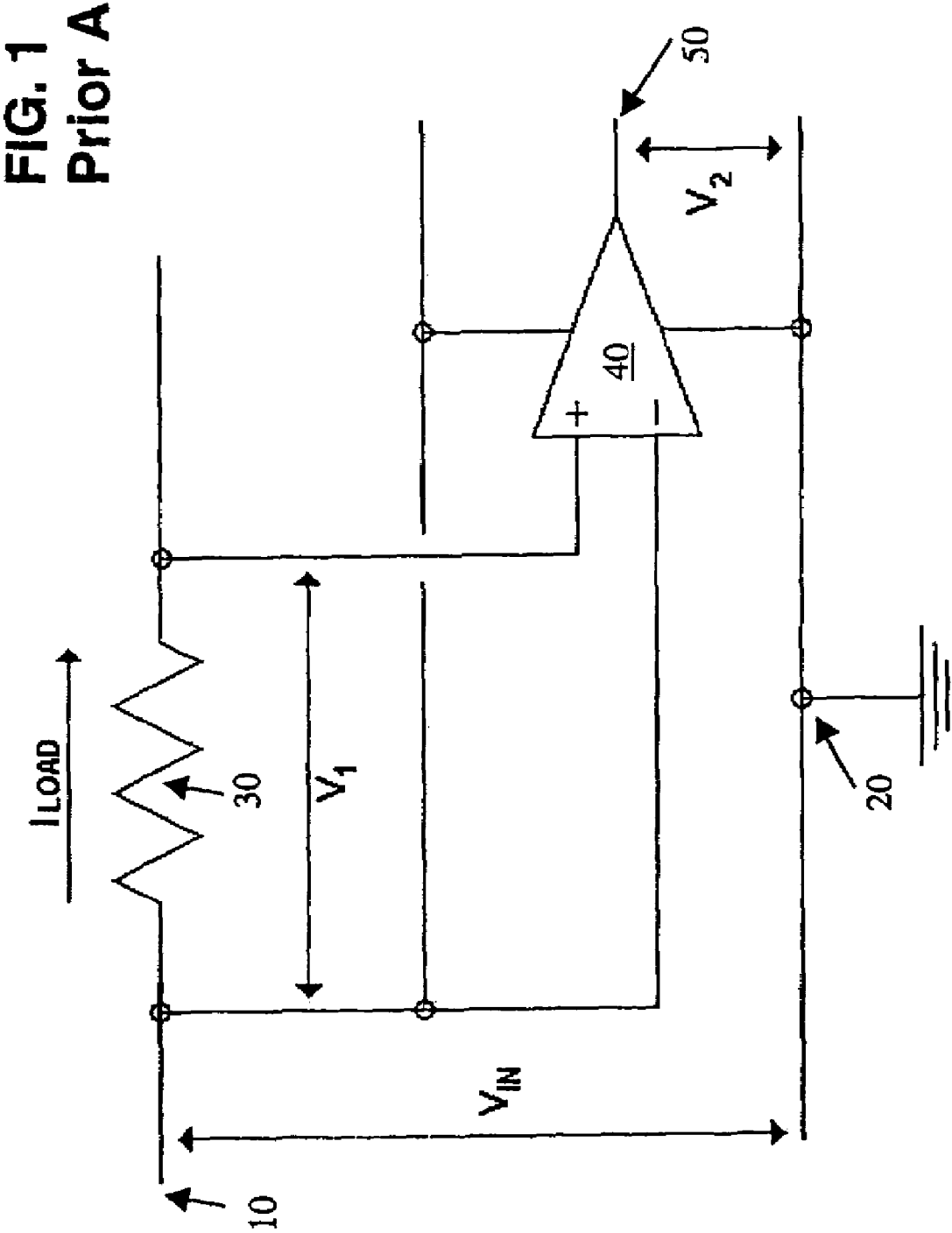
FIG. 1 shows a block schematic drawing illustrating a prior art current sensing high side load driver circuit.

However $V_2$ is not equivalent to the output of FIG. 1 as the voltage $V_2$ is between the output of the second amplifier 140 and $V_0$ (GND plus $V_4$), not GND.

This is why the second amplifier 160 is also used. It effectively subtracts the Voltage $V_4$ from $V_2$ and scales the output to the desired value.

Any variation in the input voltage VIN now appears as a common mode input voltage VCM for the second amplifier 160, and the equation for the output may be written as:

$$V_3 = A_2(V_2 + V_{CM}/CMRR) \qquad \text{Equation 6}$$

Where $A_2$ is the gain of the second amplifier 160.

Equation 6 may be rewritten as:

$$V_3 = A_2 * A_1 * V_1 + A_2 * V_{CM}/CMRR \qquad \text{Equation 7}$$

The overall CMRR of the above circuit represents an improvement factor of $1/A_2$ in comparison with the prior art circuit of FIG. 1.

The following numerical example illustrates the advantage of the present invention:

$V_{IN}$ varies between 6V and 12V
$V_1 = 50$ mV
$V_0$ may be set to 5V.

From equation 4 above, $V_4 = V_{IN} - V_0$, setting $V_0$ to 5V means that $V_4$ is always positive by more than the drop out voltage of the regulator 150 (assumed to be less than 1V in this example).

$A_1 = 5V/50$ mV=100, to give the maximum gain for this stage.

$A_2 = 1/A_1 = 0.01$ to give a unity gain overall.

From equation 7 above, $(V_3 = A_2 * A_1 * V_1 + A_2 * V_{CM}/CMRR)$:

$$V_3 = 100 * 0.01 * V1 + 0.01 * V_{CM}/CMRR \qquad \text{Equation 8}$$

Which can be rewritten as:

$$V_3 = V_1 + V_{CM} * 0.01/CMRR \qquad \text{Equation 9}$$

In this way the CMRR is drastically improved, rendering a single (or first) stage of a current sensing load driver circuit to be substantially immune to common mode noise.

It will be appreciated by a person skilled in the art that alternative embodiments to those described above are possible.

For example, the numerical example mentioned above represents only one of the possible set of parameters for the above circuit. Furthermore, alternative arrangements are envisaged which may differ as to their implementation details, but which are functionally equivalent to the embodiment described above.

What is claimed is:

1. An arrangement for providing an improved common mode rejection ratio in a load driver circuit having an input voltage and a ground voltage, said arrangement comprising:
   a voltage regulator adapted to regulate said ground voltage in response to variations in said input voltage and coupled to provide a regulated ground voltage;
   amplifier means including sense inputs coupled to receive voltage signals from a sense resistor of said load driver circuit, for providing an amplified output voltage;
   wherein said amplifier means is adapted to be powered by power terminals coupled to said input voltage and said regulated ground voltage respectively, such that the common mode rejection ratio of the load driver circuit is reduced.

2. The arrangement of claim 1 wherein said amplifier means includes first and second differential amplifiers.

3. The arrangement of claim 2 wherein said first differential amplifier has power terminals coupled to said input voltage and said regulated ground voltage respectively and said second differential amplifier has power terminals coupled to said input voltage and said ground voltage respectively.

4. The arrangement of claim 3 wherein said first and second differential amplifiers each have gain values adapted to produce a circuit gain value of substantially unity.

5. The arrangement of claim 4 wherein said second differential amplifier has a non-inverting input coupled to an output of said first differential amplifier and an inverting input coupled to said regulated ground voltage.

6. A load driver circuit comprising:
   an arrangement for providing an improved common mode rejection ratio in said load driver circuit having an input voltage and a ground voltage, said arrangement comprising:
   a voltage regulator adapted to regulate said ground voltage in response to variations in said input voltage and coupled to provide a regulated ground voltage;
   amplifier means including sense inputs coupled to receive voltage signals from a sense resistor of said load driver circuit, for providing an amplified output voltage;
   wherein said amplifier means is adapted to be powered by power terminals coupled to said input voltage and said regulated ground voltage respectively, such that the common mode rejection ratio of the load driver circuit is reduced.

7. The load driver circuit of claim 6 wherein said load driver circuit is a high side driver circuit comprising a high side current sense resistor.

8. The circuit of claim 7 wherein said amplifier means includes first and second differential amplifiers.

9. The circuit of claim 8 wherein said first differential amplifier has power terminals coupled to said input voltage and said regulated ground voltage respectively and said second differential amplifier has power terminals coupled to said input voltage and said ground voltage respectively.

10. The circuit of claim 9 wherein said first and second differential amplifiers each have gain values adapted to produce a circuit gain value of substantially unity.

11. The circuit of claim 10 wherein said second differential amplifier has a non-inverting input coupled to an output of said first differential amplifier and an inverting input coupled to said regulated ground voltage.

12. A method for providing an improved common mode rejection ratio in a load driver circuit having an input voltage and a ground voltage, said method comprising the steps of:
    regulating said ground voltage in response to variations in said input voltage in order to provide a regulated ground voltage;
    amplifying voltage signals received from a sense resistor of said load driver circuit using amplifier means, for providing an amplified output voltage;
    wherein said amplifier means is adapted to be powered by power terminals coupled to said input voltage and said regulated ground voltage respectively, such that said common mode rejection ratio of said load driver circuit is reduced.

13. The method of claim 12 wherein said amplifier means includes first and second differential amplifiers.

14. The method of claim 13 wherein said first differential amplifier has power terminals coupled to said input voltage and said regulated ground voltage respectively and said second differential amplifier has power terminals coupled to said input voltage and said ground voltage respectively.

15. The method of claim 14 wherein said first and second differential amplifiers each have gain values adapted to produce a circuit gain value of substantially unity.

16. The method of claim 15 wherein said second differential amplifier has a non-inverting input coupled to an output of said first differential amplifier and an inverting input coupled to said regulated ground voltage.

* * * * *